United States Patent

[11] 3,614,547

[72] Inventor John E. May
Skaneateles, N.Y.
[21] Appl. No. 19,872
[22] Filed Mar. 16, 1970
[23] Division of Ser. No. 765,292, Oct. 7, 1968, Pat. No. 3,337,174
[45] Patented Oct. 19, 1971
[73] Assignee General Electric Company

[54] TUNGSTEN BARRIER ELECTRICAL CONNECTION
5 Claims, 2 Drawing Figs.

[52] U.S. Cl. .......... 317/234, 317/235
[51] Int. Cl. .......... H01l 5/00
[50] Field of Search .......... 317/234, 235

[56] References Cited
UNITED STATES PATENTS 3,228,104 1/1966 Emeis .......... 29/482
3,233,309 2/1966 Emeis .......... 317/234 X
3,382,568 5/1968 Kuiper .......... 29/578
3,532,591 10/1970 Fasnocht .......... 317/234 X
3,537,174 11/1970 May .......... 29/577

*Primary Examiner*—James D. Kallam
*Attorneys*—Robert J. Mooney, Nathan J. Cornfeld, Carl O. Thomas, Frank L. Neuhauser, Oscar B. Waddell and Joseph B. Forman

ABSTRACT: A tungsten or molybdenum electrical connector is attached to a surface of a semiconductor element adjacent an N-type region by a bonding layer comprised of aluminum. A tungsten or molybdenum refractory metal barrier layer is interposed between the bonding layer and the semiconductor surface, and thin refractory metal silicide layers are interposed between the bonding layer and the electrical connector and barrier layer. The bonding layer may be formed of an alloy of silicon and aluminum. An aluminum preform may be initially stacked between the refractory metal surfaces to form the bonding layer. The refractory metal silicide may be formed before bonding or may be formed by reaction of silicon with the refractory metal surfaces during bonding. The resulting electrical connection formed exhibits reduced internal resistance.

PATENTED OCT 19 1971 3,614,547

INVENTOR:
JOHN E. MAY,

BY Carl O. Thomas
HIS ATTORNEY.

TUNGSTEN BARRIER ELECTRICAL CONNECTION

This invention relates to a low resistance ohmic connection for a semiconductor element adjacent an N-type conductivity region thereof and is a division of my copending application, Ser. No. 765,292, filed Oct. 7, 1968 now U.S. Pat. No. 3,537,174, issued Nov. 3, 1970.

In providing a terminal lead connection to an N-type region of a semiconductor element it is a conventional practice to utilize aluminum to solder the metallic electrical connector to the surface of the semiconductor element. The molten aluminum dissolves a surface portion of the semiconductor element which is epitaxially redeposited as the aluminum cools to ambient temperature. The proportion of N-type donor impurities in the semiconductor material redeposited may, however, be reduced because of a greater solubility in the melt. Also, aluminum, which is a P-type dopant material, may be incorporated in the epitaxially redeposited semiconductor material. This has the effect of reducing the net N-type conductivity of the surface portion of the semiconductive element. A substantial contact resistance has been observed for terminal connections to N-type conductivity regions of semiconductor elements where the electrical connector is joined to the semiconductor element by an aluminum solder.

It is, therefore, an object of my invention to provide a novel ohmic connection to an N-type conductivity region of a semiconductor element using an aluminum solder that exhibits a reduced level of contact resistance.

This and other objects of my invention are accomplished in one aspect by providing a low resistance ohmic connection for a semiconductor element having adjacent one surface portion an N-type conductivity region which is comprised of a layer deposited on the surface portion comprised of a refractory metal chosen from the class consisting of tungsten and molybdenum. A layer comprised of a silicide of the refractory metal is deposited on the refractory metal layer, and a bonding layer comprised of aluminum overlies the refractory metal silicide layer.

Figure 1:
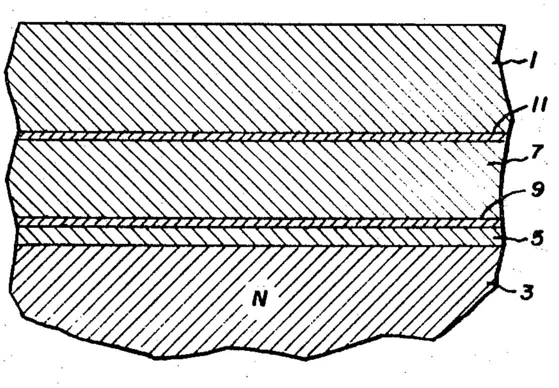
Figure 2:
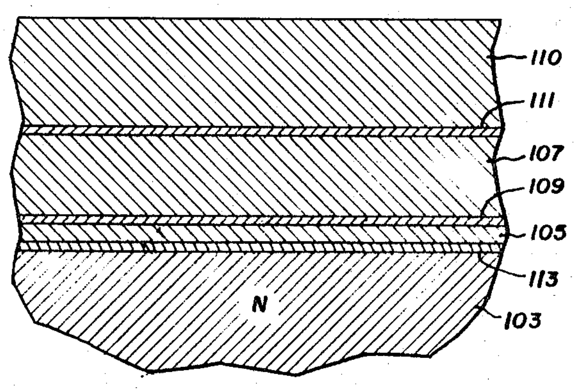

My invention may be better understood by reference to the following detailed description considered in conjunction with the drawings, in which FIG. 1 is a partially schematic sectional detail of a connector according to my invention, and FIG. 2 is a partially schematic sectional detail of an alternate connector according to my invention.

In FIG. 1 an electrical connector 1 formed of a refractory metal, such as tungsten or molybdenum, is shown attached to an N-type conductivity region 3 of a semiconductor element according to my invention. Adhered directly to the surface of the semiconductor element is an impervious barrier layer 5 comprised of tungsten or molybdenum. The connector and barrier layer are joined by a bonding layer 7 comprised of aluminum. Lying at the intersection of the bonding layer and the barrier layer is a layer 9 formed of a silicide of tungsten or molybdenum. A similar layer 11 lies at the intersection of the bonding layer and the connector. Each of the layers form a tenacious, void-free, low resistance interconnection to the juxtaposed layers, so that the electrical connector is firmly attached to the N-type region of the semiconductor element and a minimum voltage drop across the electrical connection when a current is being conducted.

The semiconductor element may be formed of any conventional type of semiconductor material, such as silicon, germanium, gallium arsenide, etc. and may be provided with a region adjacent the surface to be bonded of N, P, or intrinsic conductivity type. The greatest reduction in contact resistance as compared to the conventional arrangement of aluminum bonded directly to the semiconductor material, and hence the greatest advantage, is achieved when the semiconductor element includes a nondegenerate N-type region adjacent the bonding surface. With very high N-type doping levels withdrawal of N-type impurity material from the semiconductor element by aluminum solder does not appreciably increase the contact resistance in view of the large amount of N-type impurity material present. At lower doping levels the loss of N-type impurity material through aluminum soldering significantly affects contact resistance. For silicon a significant improvement in contact resistance as compared to direct soldering with aluminum is achieved when the N-type impurity atom concentration is below $10^{21}$ impurity atoms per cubic centimeter. The semiconductor element may be a single junction diode or have a plurality of junctions as in a transistor or thyristor. It is considered unnecessary to describe any specific semiconductor element or device in detail, since it is appreciated that the inventive electrical connection may be substituted for conventional electrical connections to semiconductor elements, as desired. The impervious barrier layer 5 is formed of the refractory metals tungsten and/or molybdenum. Suitable barrier layers may be laid down using conventional deposition techniques, such as electron beam depositing, sputtering, chemical vapor deposition, etc. Molybdenum and tungsten are employed as barrier layers, since they exhibit low thermal coefficients of expansion that more nearly match those of semiconductor materials than most other metals; they both are relatively chemically unreactive and electrically and thermally conductive; and both remain stable in the solid phase to temperature levels well above the melting temperatures of aluminum. Of the two refractory metals tungsten is preferred because of its superior thermal stability, allowing a wider range of aluminum soldering temperatures.

The thickness of the barrier layer is not critical and may be varied widely. The barrier layer is preferably maintained at the minimum thickness necessary to prevent aluminum migration therethrough, although aluminum penetration may be permitted, as is more fully discussed below. The maximum thickness of the barrier layer is generally chosen to avoid undue stresses being induced by thermal cycling of the semiconductor element in use. For example, where a semiconductor device is to be cycled through a temperature range of from −40° C. to 125° C. during use the maximum thickness of the barrier layer may be safely set at 0.2 mils. When lower ranges of thermal cycling are anticipated, the thickness of the barrier layer may be further increased.

In the FIG. 1 form of the invention the electrical connector 1 is formed of the refractory metals tungsten and/or molybdenum, as is commonly practiced in the art. When it is attempted to solder pure aluminum directly to tungsten or molybdenum, the aluminum chemically combines with the refractory metal with the result that very poor adhesion results. I have discovered quite unexpectedly that if a thin layer of the silicide of the refractory metal is interposed between the refractory metal surface and the aluminum a very strong and adherent bond may be obtained.

I have devised several useful techniques for obtaining the tungsten or molybdenum silicide layers at the intersection of the aluminum bonding layer and the refractory metal surface. According to one approach the aluminum bonding layer may be formed of an alloy of aluminum and silicon. The molten silicon present in the alloy then reacts at the surface of the refractory metal to form the refractory metal silicide. That this should occur is not obvious, since neither tungsten nor molybdenum normally reacts directly with a juxtaposed layer of silicon at temperatures below the melting point of aluminum. It should be noted in this connection that where the alloy of aluminum and silicon lies at or near the eutectic and in all instances in which the silicon content of the melt is below the eutectic the temperature of the melt is below the melting point of pure aluminum. The proportion of silicon in the solder is not critical and may vary widely. Usually no more than the eutectic proportion of silicon, 11.6 percent, by weight, is employed. The solder may initially contain as little as 3.5 percent, by weight, silicon where the silicon is to be entirely derived from the solder in forming the silicide layers. It is, of course, recognized that in the completed device substantially all of the silicon initially present in the bonding layer may be depleted in forming the silicide layers.

A distinct advantage in using alloys of aluminum and silicon to form the refractory metal silicide layer is that the procedure may be practiced merely by substituting the silicon containing alloy for the conventional aluminum solders heretofore employed. The formation of the refractory metal silicide at the desired location occurs spontaneously and concurrently with soldering. Except for the preliminary step of providing the barrier layer then, the process steps are generally analogous to conventional aluminum soldering techniques.

In an alternate approach of forming the electrical connection of FIG. 1 a sandwich may be formed employing as the outer members the connector 1 and the semiconductor element 3 with the barrier layer 5 attached. Within the sandwich an aluminum foil or other aluminum containing preform is located with thin silicon discs between the aluminum preform and the refractory surfaces. Heating of the preform to its melting temperature allows the aluminum to dissolve at least a portion of the silicon discs to form an adherent bond thereto, while the silicon discs at the same time react with the refractory metal surfaces to form refractory metal silicide layers. In still another variation the refractory metal surfaces may be preliminarily provided with a refractory metal silicide layer according to any conventional approach, and aluminum solder or an aluminum preform thereafter employed to bond to the silicide layers. It is, of course, recognized that conventional aluminum alloys, including aluminum-silicon alloys, may be used to form the silicide layer.

The FIG. 1 form of the invention has been described with reference to the use of a tungsten or molybdenum electrical connector 1. It is appreciated that in many applications it may be desirable to utilize electrical connectors formed of other electrically conductive materials that bond readily to aluminum. In such instance the metal silicide layer between the aluminum and the connector may be omitted.

In FIG. 2 an alternate connection is illustrated which is specifically applicable to silicon semiconductor elements. The electrical connector 110, identical to connector 1, is attached to the silicon semiconductor element 103, which aside from being limited in composition to silicon as a semiconductor material, is otherwise initially identical to semiconductor element 3. To achieve bonding an aluminum pervious barrier layer 105 is deposited on the surface of the semiconductor element 103, preferably adjacent an N-type conductivity region. The barrier layer is formed of tungsten and/or molybdenum. The deposition of such pervious layers may be accomplished by various chemical deposition techniques known to the art. For example, tungsten may be deposited as an aluminum pervious layer by reacting hydrogen and tungsten hexafluoride in the vapor phase. After the pervious refractory metal layer is deposited, bonding to the electrical connector is achieved by using an aluminum solder to form the bonding layer 107.

In this instance the aluminum solder may be pure aluminum or any other conventional aluminum solder employed in bonding aluminum directly to a semiconductor element surface. The molten aluminum penetrates the barrier layer so that a minor amount of the aluminum achieves direct contact with the silicon surface. The molten aluminum contacting the silicon surface melts a very small amount of the silicon which rapidly diffuses back through the barrier layer. The dissolved silicon then reacts with the exposed refractory metal surfaces to form the refractory metal silicide layers 109 and 111 corresponding to refractory metal layers 9 and 11.

Additionally, a thin penetration layer 113 is formed. This layer will include a small amount of epitaxially redeposited silicon and a thin layer of refractory metal silicide. The presence of the barrier layer keeps the contact of aluminum with the silicon to a low level, so that the thickness of the silicon redeposited is very thin as compared to that obtained by the conventional approach of bonding aluminum directly to a silicon surface without an interposed barrier layer.

Where silicon is alloyed with the aluminum, the barrier layer may be either pervious or impervious. No matter how thin the barrier layer may be, it will represent some obstruction to the direct contact of the aluminum with the silicon surface and offer some advantage. Where silicon-free aluminum is employed to form the bonding layer, it is appreciated that the porosity of the barrier layer is preferably increased as the thickness of this layer is increased. It is not in all instances necessary that aluminum solders lacking silicon be used with barrier layers that are initially pervious. If the barrier layer is relatively impervious to aluminum, but quite thin, the molten aluminum upon contact with the barrier material will react therewith until a migration path for the molten aluminum is formed. The further direct reaction of aluminum with the barrier material is suppressed by formation of the refractory metal silicide. For example, the tungsten surfaces brought into contact with silicon-free aluminum solder initially react with the aluminum to form $WAl_5$ and $WAl_{12}$ when silicon is not present in the aluminum melt; with silicon present the tungsten reacts with silicon and the further formation of tungsten aluminum compounds is suppressed. It is further recognized that in depositing the barrier layer on a semiconductor surface of even slight roughness protrusions of semiconductor material through the barrier will be present to provide silicon required to form the refractory metal silicide.

To specifically illustrate the invention a number of planner diffused silicon semiconductor pellets were chosen having two N-type conductivity regions and two P-type conductivity regions interleaved, as is conventional in pellets used in silicon controlled rectifiers. The P-type conductivity layers were each 2.8 mils in thickness while the central N-type conductivity layer was 9.0 mils in thickness and the outer N-type conductivity layers was 0.8 mils in thickness. The outer N-type conductivity layer exhibited an N-type impurity concentration of 5 X $10^{20}$ atoms per cubic centimeter.

The pellets were prepared for bonding to tungsten backup plates by sandblasting the surfaces. Each pellet was cleaned sequentially with detergent, trichloroethylene, and acetone and then boiled in nitric acid, rinsed in distilled water, and blown dry.

The pellets were placed in a vapor deposition reactor to receive a tungsten barrier layer. Prior to tungsten deposition the reactor was evacuated to a pressure of about 25 microns of mercury, flushed with argon, reevacuated, then back filled and flushed with hydrogen for about 10 minutes. The reactor was brought to a temperature of 230° C. with hydrogen flowing at the rate of 2.4 cubic feet per hour and tungsten hexafluoride thereafter flowing at the rate of 0.06 cubic feet per hour, the volume of each gas being computed at STP. Each pellet exhibited a weight increase of 0.010 gram, attributable to tungsten deposition.

To provide the bonding layers the pellets were placed in a bell jar evaporative coater and the ambient pressure reduced to $10^{1165}$ mm. Hg. An aluminum surface coating of 0.3 mils thickness was formed. To remove the tungsten and aluminum from the edges of the pellets, a 2.14 $cm^2$. area was masked on each of the opposite major surfaces of each pellet, and the metal layers were etched from the pellet edges.

Each pellet with the tungsten barrier layers and aluminum bonding layers attached was stacked between tungsten back up plates, one 20 mils thick and the remaining 80 mils thick, in a graphite fixture, which maintained the elements in vertical alignment. The stacked elements were then passed through a tunnel oven so that they were slowly heated to 710° C. and then slowly cooled.

The pellet assemblies having the back up plates attached were then fabricated into gate controlled silicon controlled rectifiers of the C180 model type described in General Electric Company specification number 170.52, published Dec. 1965. Such devices are commercially available. At the same time a number of controls were formed for purposes of comparison, the pellets and packaging being identical, except that the step of depositing tungsten was omitted. Of 8 rectifiers tested having tungsten barrier layers the average forward voltage drop at 1,500 amperes was 2.04 volts, whereas of 6 control rectifiers tested lacking tungsten barrier layers the average forward voltage drop when identically tested was 2.63 volts. This showed an appreciable decrease of internal resistance in the inventive rectifiers.

In variations on the formation process noted above the weight of tungsten deposited was varied from 0.006 to 0.0232 gram of tungsten without any observable variation in the forward voltage drop. Similarly, when 2 mil aluminum preforms were substituted for the evaporated aluminum layers, the characteristics of the rectifiers were unaffected. On the other hand, when dense tungsten barriers slightly above 5,000 Angstroms in thickness were formed by electron beam deposition, the tungsten backup plates would not adhere to the semiconductor element, this being attributable to the formation of aluminum tungsten compounds. When a thin layer of silicon was placed over the tungsten barrier layer preliminarily, however, the backup plates adhered well and the above noted improvement in internal resistance was observed. In another variation, instead of chemically vapor depositing tungsten, 1,000 Angstrom tungsten barrier layers were formed by sputtering. The bonding layers were then formed of the aluminum-silicon eutectic (11.6 percent by weight silicon and the balance aluminum). The bonding layers were 0.5 mil in thickness. The resulting rectifiers exhibited low internal resistances as noted above, the forward voltage drops being 2.0 volts. Improvement in internal resistances were also obtained using molybdenum and mixed molybdenum and tungsten barrier layers.

While I have described my invention with reference to certain preferred embodiments, it is appreciated that variations will readily occur to those skilled in the art. It is accordingly intended that the scope of my invention be determined with reference to the following claims.

What I claim as new and desire to secure by Letters Patent of the United States is:

1. A low resistance ohmic connection for a semiconductor element having adjacent one surface portion an N-type conductivity region comprising a layer deposited on said surface portion, said layer comprising a refractory metal chosen from the class consisting of tungsten and molybdenum, a layer comprising a silicide of the refractory metal contacting the refractory metal layer, and a bonding layer comprising aluminum overlying the refractory metal silicide layer.

2. A low resistance ohmic connection according to claim 1 in which said semiconductor element comprises silicon.

3. A low resistance ohmic connection according to claim 1 in which said bonding layer comprises an alloy of aluminum and silicon.

4. A low resistance ohmic connection according to claim 1 additionally including an electrical contact means comprising a refractory metal, chosen from the class consisting of tungsten and molybdenum, bonded to said semiconductor element with a layer comprised of a silicide of said refractory metal interposed between and adhered to said bonding layer and said contact means.

5. A low resistance ohmic connection for a silicon semiconductor element having adjacent one surface portion an N-type conductivity region of less than $10^{21}$ N-type impurity atoms per cubic centimeter comprising a layer which comprises tungsten on said surface portion, a tungsten electrical connector, tungsten silicide layers formed on the adjacent surfaces of the tungsten layer and the tungsten electrical connector, and a layer comprising aluminum bonding said tungsten silicide layers on said adjacent surfaces of said tungsten layer and said tungsten electrical connector to bond said tungsten electrical connector to said surface portion of the semiconductor element.